(12) United States Patent
Williams et al.

(10) Patent No.: US 7,994,798 B2
(45) Date of Patent: Aug. 9, 2011

(54) POWER CONVERTER CURRENT SENSOR TESTING METHOD

(75) Inventors: Joshua Michael Williams, Peoria, IL (US); Benjamin Paul Gottemoller, Peoria, IL (US); Robert Lindsey, Washington, IL (US); Mark Edward Hartman, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 333 days.

(21) Appl. No.: 11/987,544

(22) Filed: Nov. 30, 2007

(65) Prior Publication Data
US 2009/0140745 A1 Jun. 4, 2009

(51) Int. Cl.
*G01R 31/02* (2006.01)
(52) U.S. Cl. ........... 324/537; 363/79; 340/664; 318/139
(58) Field of Classification Search .................... 324/537
See application file for complete search history.

(56) References Cited

U.S. PATENT DOCUMENTS

| | | | |
|---|---|---|---|
| 5,280,251 A | 1/1994 | Strangio | |
| 5,739,649 A * | 4/1998 | Akao | 318/139 |
| 5,998,880 A | 12/1999 | Kumar | |
| 6,008,599 A | 12/1999 | Beck | |
| 6,104,304 A * | 8/2000 | Clark et al. | 340/664 |
| 6,188,584 B1 * | 2/2001 | Arai et al. | 363/16 |
| 6,496,015 B2 | 12/2002 | Stanford et al. | |
| 6,640,196 B1 | 10/2003 | Unsworth et al. | |
| 6,791,336 B2 | 9/2004 | Krigel | |
| 6,930,490 B2 | 8/2005 | Saunders et al. | |
| 6,989,641 B2 * | 1/2006 | Schulz et al. | 318/139 |
| 7,626,396 B2 | 12/2009 | Lindsey et al. | |
| 7,696,760 B2 | 4/2010 | Lindsey et al. | |
| 7,714,587 B2 | 5/2010 | Lindsey et al. | |
| 7,764,067 B2 | 7/2010 | Lindsey | |
| 2004/0189315 A1 * | 9/2004 | Muratov et al. | 324/500 |
| 2004/0196678 A1 * | 10/2004 | Yoshimura et al. | 363/79 |
| 2007/0013333 A1 * | 1/2007 | Ajima et al. | 318/432 |
| 2007/0190369 A1 * | 8/2007 | Leach et al. | 429/9 |

* cited by examiner

*Primary Examiner* — Timothy J Dole
*Assistant Examiner* — Benjamin M Baldridge
(74) *Attorney, Agent, or Firm* — Finnegan, Henderson, Farabow, Garrett & Dunner LLP

(57) ABSTRACT

A method of testing power converter current sensors is disclosed. The method may include receiving a current sensor test request and receiving measured currents from current measurements from the at least one current sensor, based on the test request. The method may further include comparing the measured current of the sensor with a stored profile and determining whether a fault exists in each current sensor being tested. The method may also include providing a user with a test report.

20 Claims, 5 Drawing Sheets

POWER CONVERTER CURRENT SENSOR TESTING METHOD

TECHNICAL FIELD

This application relates to a sensor testing method, and more particularly; to a power converter current sensor testing method.

BACKGROUND

Power converters are commonly used in a machine for motor control. Power converters use current sensors in series with the motor windings to provide feedback information characteristics of the motor. The current sensor performance parameters, such as scaling, frequency response, linearity and polarity are critical to the performance of the power converter when switching between high energy levels. If there is a malfunction in the sensor or wire harness, the power converter may become uncontrollable, and the motor system driven by the power converter may be shut down. Additionally, permanent damage may also be caused to the power components. Thus, it may be desirable to test the current sensors and their wire harness before applying high-voltage to the power converter.

Furthermore, it may also be important that the testing system is accurate. In particular, in the event of sensor or wire harness faults, it may be helpful to accurately locate the position of the fault, based on the measurements obtained by the current sensors. To accurately determine whether a particular current sensor fails, a normal range of the current value needs to be decided by properly accounting for each load characteristic. In addition, reliability is another factor to consider in the design of the testing system. In particular, it may be desirable to use low-voltage and current-limiting power supply to drive the test, so that test could be performed without damaging components, in the event of wire harness fault or current sensor failure. Finally, convenience of use is yet another desirable characteristic for the testing system. For example, the test may be performed automatically without any re-wiring of the circuit or connection of external components or without requiring special skills.

A system for testing current sensors in an electric machine is described in U.S. Pat. No. 6,989,641 to Schulz et al. ("the '641 patent"). The '641 patent describes a system for controlling a three-phase electric machine having current sensors for less than each of its phases. The control system includes a three-phase electric machine, an inverter to provide current to the electric machine, and a processor to control the inverter to test the current sensors associated with the electric machine.

The current sensor testing method described in the '641 patent includes operating the inverter to apply a testing voltage waveform to the windings with current sensors, sampling current waveforms from the current sensors, and performing tests on the waveforms to determine whether a fault exists. In one instance, the magnitudes of the current waveforms, sampled from two current sensors in the testing windings, are compared. A threshold is used to determine whether the difference between the two current magnitudes is within tolerance. If the difference is higher than the threshold, a fault may exist in the tested windings. In another instance, a test waveform is synthesized and applied to two phases in a three-phase electric machine. All measured waveforms from the two current sensors are summed together, and compared to another threshold waveform to determine whether a fault exists.

Although the control system described in the '641 patent may be effective for testing current sensors associated with an electric machine, it may be problematic. For example, the current sensor test described in the '641 patent may not be capable to provide early indication of a fault before high-voltage is applied. As a result, power electronic devices as well as the motor may be damaged due to current sensor failure and/or wiring faults. Furthermore, although the system described in the '641 patent may be able to indicate whether a fault exists, it may be incapable to accurately determine which sensor, or sensors, fail. In addition, the system described in the '641 patent may provide insufficient reliability. For example, the system described in the '641 patent uses a DC source directly coupled to the inverter without any current limiting components. As a result, components in the tested windings, for example, power electronic devices, may be damaged in the event of wire harness fault or current sensor failure. Finally, the system provided by the '641 patent may not be convenient to use.

The disclosed power converter current sensor testing system is directed towards overcoming one or more of the shortcomings set forth above.

SUMMARY

In one aspect, a method of testing power converter current sensors is disclosed. The method may include receiving a current sensor test request and receiving measured currents from current measurements from the at least one current sensor, based on the test request. The method may further include comparing the measured current of the sensor with a stored profile and determining whether a fault exists in each current sensor being tested. The method may also include providing a user with a test report.

In another aspect, a power converter current sensor testing system is disclosed. The power converter current sensor testing system may include a power source configured to provide power to at least one power converter and a controller electrically coupled to the at least one power converter. The controller may be configured to receive a current sensor test request, receive current measurements from the current sensors, according to the test request, detect a fault in each current sensor being tested, by comparing the measured current of the sensor with a stored profile, and generate a test report. The power converter current sensor testing system may further include a display device configured to display the test report.

DETAILED DESCRIPTION

Figure 1:
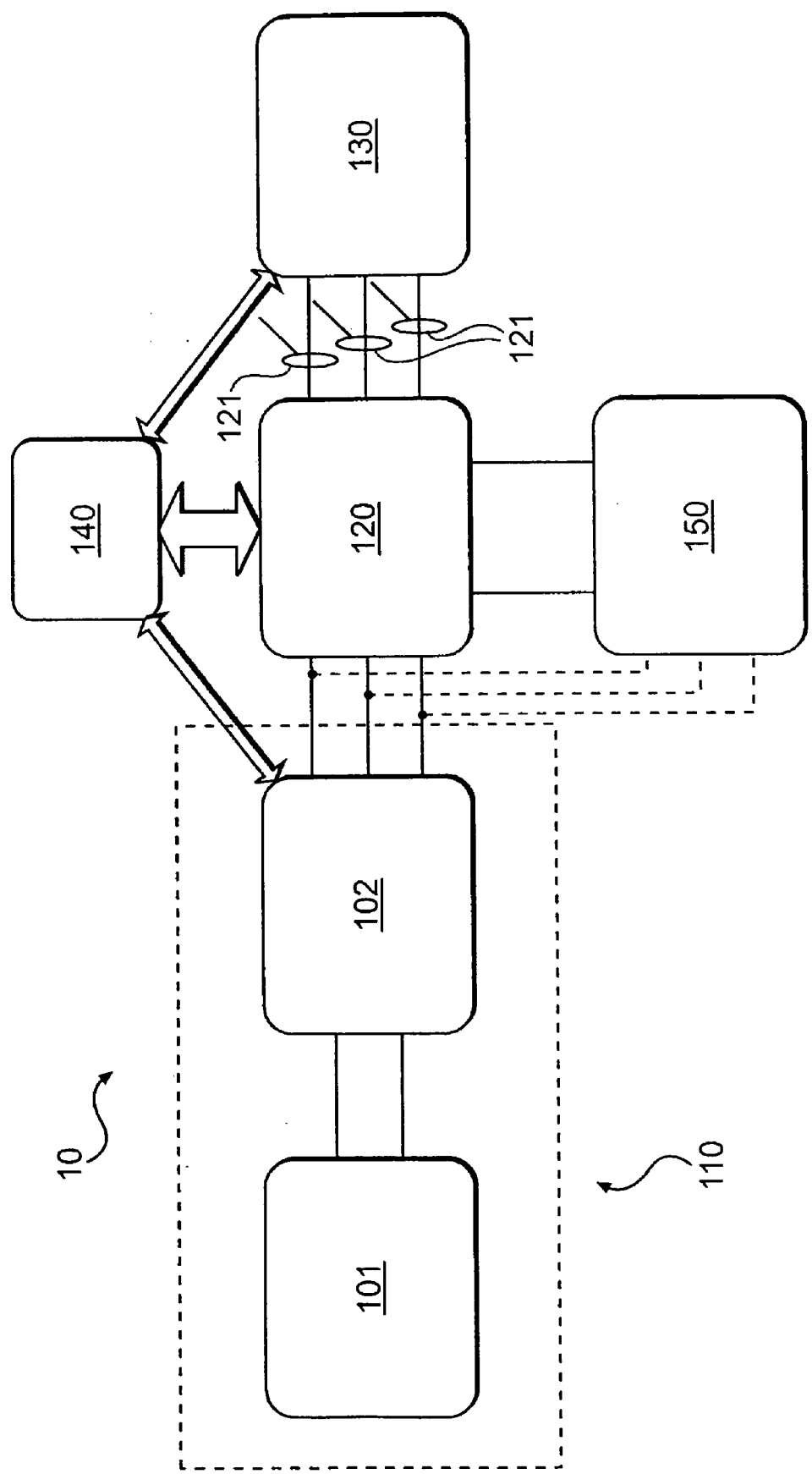
FIG. 1 provides a block diagram of a machine in accordance with an exemplary embodiment of the present disclosure.

FIG. 1 provides a block diagram of a machine in accordance with an exemplary embodiment of the present disclosure. Machine 10 may include, among other things, a power source 110, a power electronics system 120, a traction system 130, a control system 140, and a current sensor testing system 150. Machine 10, as the term is used herein, refers to a fixed or mobile machine that may perform some type of operation associated with a particular industry, such as mining, construction, farming, etc. and operate between or within work environments. Examples of machines include trucks, cranes, earth moving vehicles, mining vehicles, backhoes, material handling equipment, farming equipment, marine vessels, and on-highway vehicles.

Power source 110 may include various components configured to provide electric power for use by one or more systems of machine 10. Power source 110 may include a prime mover 101 and a generator 102 driven by prime mover 101. Prime mover 101 may be a combustion engine, such as, for example, a diesel engine. Generator 102 may be an AC generator, or otherwise known as an alternator, that generates alternating voltage by rotating a coil in the magnetic field or by rotating a magnetic field within a stationary coil. Alternatively, power source 110 may include any other suitable device for providing a power output such as, for example, a battery, a fuel cell, or any other type of power source configured to provide electrical power to machine 10.

Power electronics system 120 may include at least one power converter. Examples of power converters may include a power inverter that converts DC current to AC power and a power rectifier that converts AC current to DC power. Each power converter may have at least one phase and each phase may include a current sensor configured to measure the current flowing through that phase. Current sensors 121 may provide current information, such as, for example, the magnitude of a current, the frequency of a current (if the current is an AC current), the polarity of the current and a complete profile of the current as a function of time or frequency. Current sensor measurements may be indicative of the characteristics of the loads that power electronics system 120 drives, for example, traction system 130. Therefore, the performance of current sensors 121 is important to the performance of power electronics system 120.

Power electronics system 120 may be electrically coupled to power source 110 via one set of conductors, and to traction system 130 via another set of conductors. Power electronics system 120 may be configured to convert power provided by power source 110 into power forms required by traction system 130. Power electronics system 120, for example, may include a power rectifier to convert AC voltage supplied by power source 110 to a DC voltage output, and may further include a power inverter to convert the DC voltage to an AC voltage of a certain waveform. Power electronics system 120 may provide voltage and/or current outputs to drive traction system 130 and control system 140.

Traction system 130 may include at least one load. The at least one load may be directly coupled to power source 110, or may be coupled to power source 110 via the power electronics system 120. Each load may have at least one phase and may be connected with a power converter with equal number of phases in the power electronics system 120. One example of the load may be an electric motor, such as an AC induction motor, a brushless DC motor, a variable or switched reluctance motor, a stepper motor, a linear motor, or any other type of motor.

Control system 140 may be coupled to power electronics system 120 and configured to provide control signals and receive feedback. For example, control system 140 may be configured to communicate with current sensors 121 associated with the power electronics system 120, determine appropriate control signals based on the current sensor measurements, and send the control signals to power electronics system 120. Control system 140 may also be coupled to traction system 130, and/or power source 110 to perform one or more control functions.

Current sensor testing system 150 may be included as an integral part of power electronics system 120 and control system 140. Alternatively, current sensor testing system 150 may be external to these systems, for example, as part of a separate electronic control module (ECM) associated with machine 10.

Current sensor testing system 150 may be electrically coupled to power electronics system 120 and configured to test current sensors 121. Current sensor testing system 150 may be electrically coupled to power source 110 and receive power from power source 110. Alternatively, current sensor testing system 150 may include an internal power source, for example, a DC power source such as a DC to DC power converter.

Current sensor testing system 150 may be configured to test current sensors 121 associated with power electronics system 120, and notify an operator of the testing results. According to one embodiment, current sensor testing system 150 may be configured to receive current measurements from current sensors 121, determine whether a sensor fault exists and diagnose the fault. Current sensor testing system 150 may also be configured to generate a test report based on the diagnostic analysis, and display a test report to notify the operator of the machine.

Figure 2:
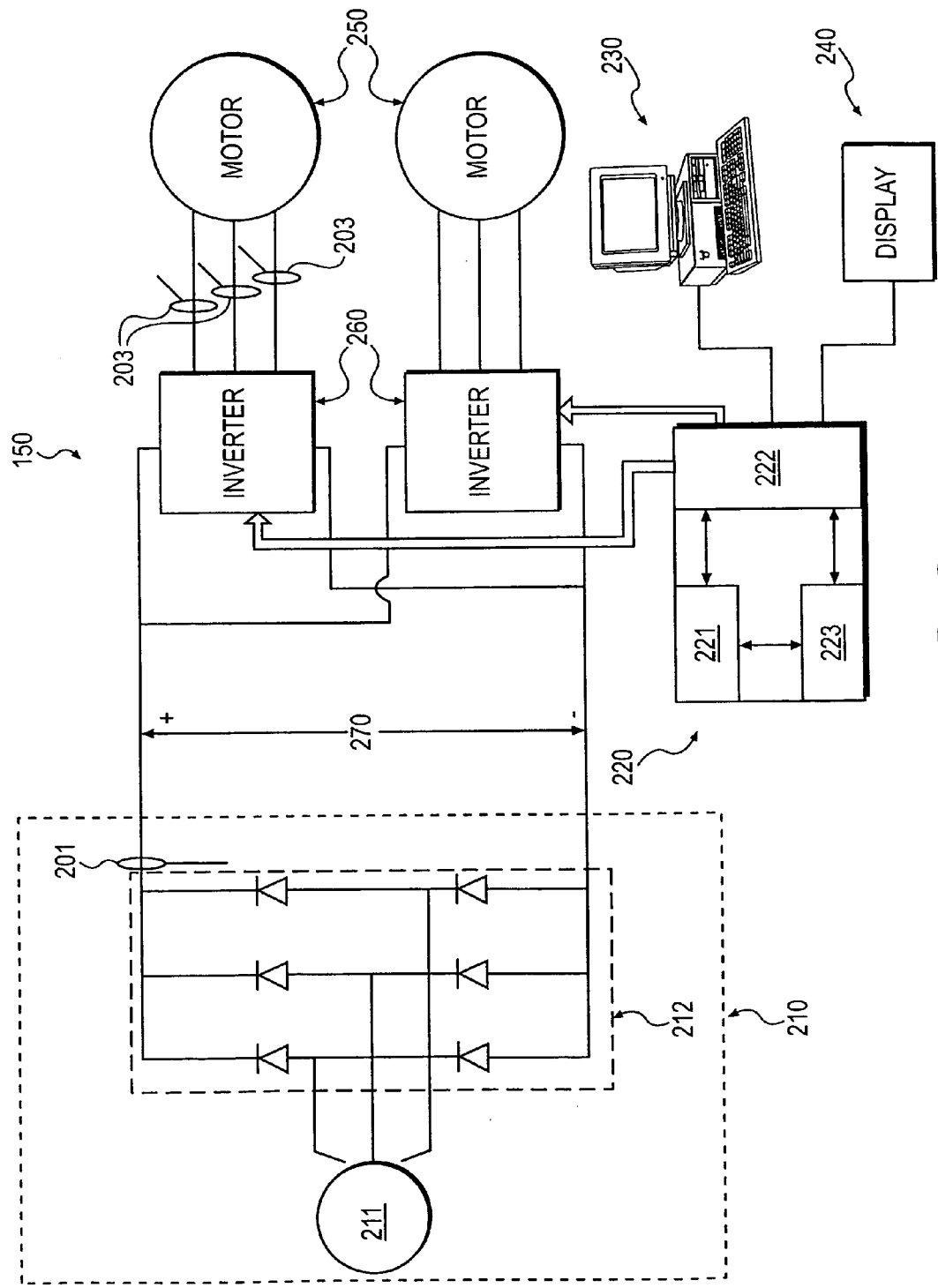
FIG. 2 provides a diagrammatic illustration of a power converter current sensor testing system, in accordance with an exemplary embodiment of the present disclosure.

FIG. 2 provides a diagrammatic illustration of a power converter current sensor testing system, in accordance with an exemplary embodiment of the present disclosure. As illustrated in FIG. 2, current sensor testing system 150 may also include, among other things, a controller 220, a user input interface 230, and a display device 240.

Power source 210 may include an AC generator 211 and a power rectifier 212. AC generator 211 may generate alternating voltage by rotating a coil in a magnetic field or by rotating a magnetic field within a stationary coil. For purposes of illustration, FIG. 1 shows a three-phase AC generator 211 and a three-phase power rectifier 212. However, both AC generator 211 and power rectifier 212 may have any suitable number of phases. Power rectifier 212 may include a plurality of power electronic devices and be configured to convert AC current to DC current. For example, as illustrated in FIG. 2, power rectifier 212 may include 6 power diodes, 2 in each phase and connected in series. The power diodes may reverse the negative portion of the AC waveform, allowing it to merge with the positive part to produce an entirely positive DC current. Power source 210 may further include a current sensor 201 to measure the output DC current from the rectifier. Power rectifier 212 may produce a DC link voltage of less than 200 volts, for the purpose of current sensor testing.

Traction system 130 may include at least one electric motor 250. For purposes of illustration, two electric motors and two power inverters are shown in FIG. 2. However, traction system 130 may include any suitable number of electric motors 250, and power inverters 260.

Power inverters 260 may be electrically coupled to power source 210. Power inverters 260 may be coupled, in parallel, to power source 210 by the DC link 270. Power inverter 260 may have at least one phase and may be electrically coupled to an electric motor 250 having an equal number of phases. Power inverter 260 may include a plurality of power electronic devices such as, for example, power diodes, thyristors, power MOSFETs (metal-oxide semiconductor field-effect transistors) and IGBTs (insulated gate bipolar transistors).

Power inverter 260 may be configured to switch the plurality of power electronic devices on and off to output currents in only selected phases.

Power inverters 260 may have at least one phase and incorporate at least one current sensor 203 in series to monitor the driving current in that phase. For example, as illustrated in FIG. 2, a three-phase power inverter 260 may have three current sensors. The number of current sensors required may be one less than the number of phases included in power inverter 260. However, a redundant current sensor may be incorporated to provide additional information for testing of the sensor and wire harness. In addition, the redundant current sensor may also be used as a backup sensor while a sensor fails, which may improve the reliability of power electronics system 120.

Controller 220 may be coupled to power inverters 260 and configured to provide control signals to power inverters 260 during a current sensor test, and receive current sensor signals from current sensors 203. Controller 220 may be configured to process the received signals and determine whether a fault exists in at least one current sensor. According to one embodiment, controller 220 may be coupled to a user input interface 230 to receive a test request from a user. According to another embodiment, controller 220 may also be coupled control system 140 in FIG. 1 to receive a test request at "key-on". Controller 220 may be further coupled to a display device 240 to display the test results.

Controller 220 may include, among other things, a storage unit 221, a communication unit 222, and a processing unit 223, and the three units may be configured to transfer data, send or receive instructions, among each other. Storage unit 221 may include a memory device such as, for example, a hard disk, a flash drive or a RAM, and be configured to store profiles containing threshold values and waveforms of current sensor measurements. The profile of each current sensor may be stored as a look up table in storage unit 221 and each profile may correspond to one condition of electric motor 250. Each threshold may be a value or a range of values. Each threshold may be in a form of absolute value or a percentage value. Storage unit 221 may be further configured to store characteristic data associated with power source 210, electric motors 250, and power inverters 260 of current sensor testing system 150, as well as characteristic data associated with any other components of machine 10.

Communication unit 222 may include an analog to digital converter (ADC), a data buffer, and a control signal generating device. Communication unit 222 may be coupled to power inverters 260 and configured to communicate with current sensors 203 and receive current sensor measurements. Communication unit 222 may be further configured to generate power converter switching control currents with the control signal generating device, and send the currents to the plurality of power electronic devices in power inverters 260. Communication unit 222 may also be coupled to the user input interface 230 and configured to receive a test request from a user. Alternatively, communication unit 222 may be coupled to control system 140 to receive an automatically generated test request. Communication unit 222 may send the test request to processing unit 223.

Processing unit 223 may include a processing device and a data buffer. The processing device may be, for example, a CPU, a microprocessor, or a digital signal processor (DSP). Processing unit 223 may be configured to receive a test request from communication unit 222, process the test request, generate a switching plan for a plurality of power electronic devices in at least one power converter, and send the switching plan to communication unit 222. Processing unit 223 may also be configured to receive current sensor measurements from communication unit 222, obtain current sensor profiles from storage unit 221 based on the characteristic data included in the test request, compare the measurement values to the profiles, and determine whether any measurements are out of range and thus, a fault occurs. Communication unit 222 may be further coupled to the display device 240 and configured to receive a test report from processing unit 223 and send the test report to the display device 240.

Processing unit 223 may also be configured to determine the current sensor profile on-the-fly, based on the characteristic data contained in the test request. For example, if a current sensor has to be replaced, processing unit 223 may determine a new profile for the new sensor upon request. The determined profile may be compared to the measurements to determine faults. The determined profile may also be sent to storage unit 221 and stored in the look-up table.

The processing unit 223 may store a diagnostic software that can be executed to perform a diagnosis if a fault is detected and determine the exact location of the fault. The processing unit 223 may be further configured to generate a test report and send the test report to communication unit 222. Based on the test request, the processing unit 223 may determine protection actions to be performed and send an instruction to communication unit 222. For example, in the event of a wire harness fault, the processing unit 223 may send an instruction to switch the corresponding power inverter 260 off to protect power inverter 260 and associated electric motor 250.

User input interface 230 may be a computer, an operator console, or a handheld operator panel. User input interface 230 may be coupled to controller 220 via communication cables, wireless networks, or other communication mediums. User input interface 230 may include graphic interface for user input and a processor for generating a test request. User input interface 230 may include a keyboard, a switch, a mouse, and/or a touch screen. User input interface 230 may be configured to generate a test request based on the user inputs, and send the test request to communication unit 222.

Display device 240 may be, for example, a computer, an operator panel, or an LCD. According to one embodiment, display device 240 may be an integral part of user input interface 230. Display device 240 may be coupled to controller 220 via communication cables, wireless networks, or other communication mediums. Display device 240 may be configured to receive and display a test report. Display device 240 may further include an audio unit and provide an audible indication when at least one fault is included in the test report.

Figure 3:
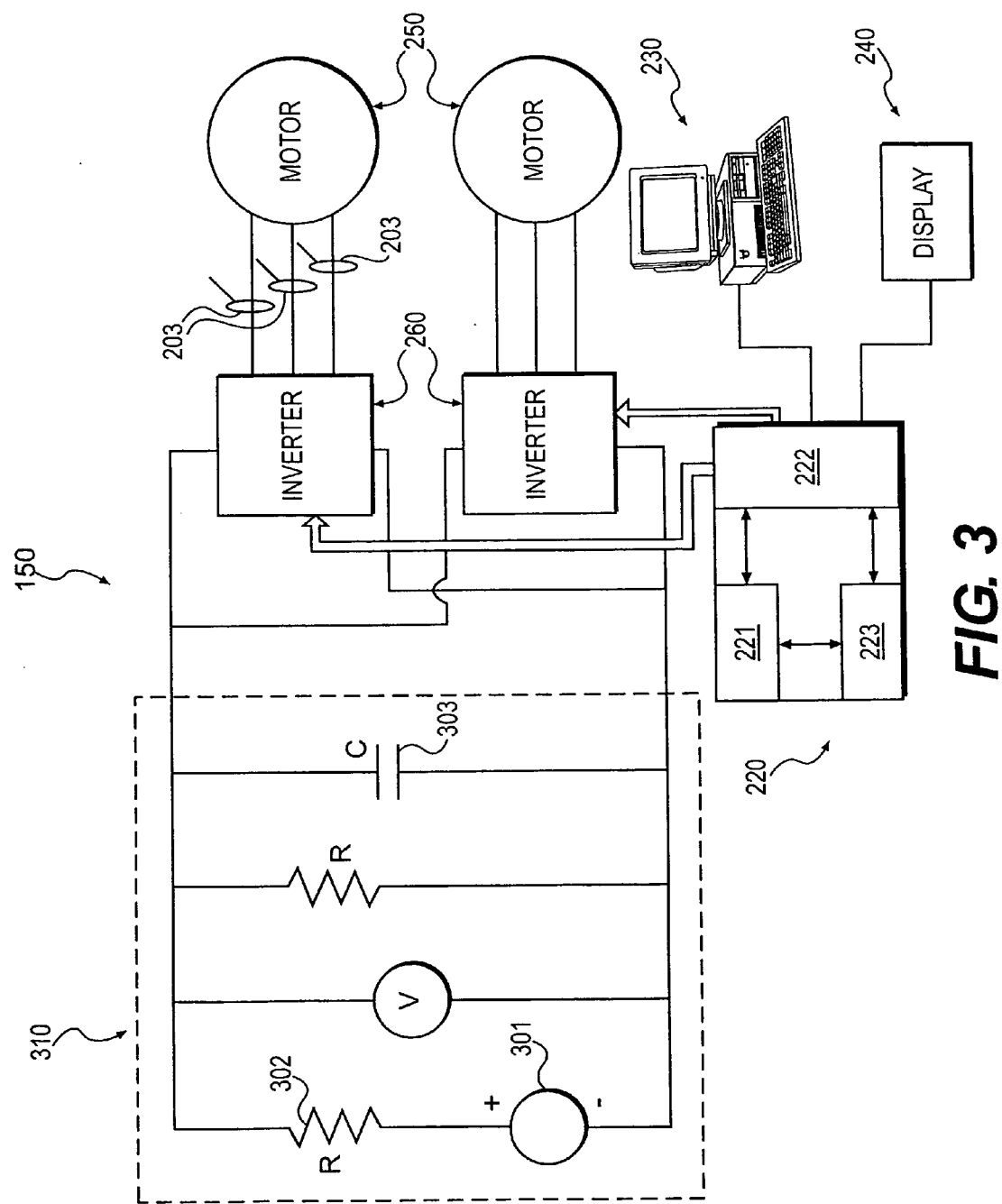
FIG. 3 provides a diagrammatic illustration of a power converter current sensor testing system, in accordance with an exemplary embodiment of the present disclosure.

FIG. 3 provides a diagrammatic illustration of a power converter current sensor testing system, in accordance with an exemplary embodiment of the present disclosure. The embodiment of FIG. 3 is similar with the embodiment disclosed in FIG. 2, except for the power source. Therefore, only power source 310 will be described in detail with reference to FIG. 3. Power source 310 may include a DC power source 301, a current-limiting device 302, and a filter capacitor 303. DC power source 301 may be a DC voltage source, such as a battery or DC to DC power converter. For the purpose of current sensor testing, DC power source 301 may be a low-voltage power source. For example, DC power source 301 may provide a low voltage, i.e., a voltage lower than 50 volts.

Current-limiting device 302 may limit the peak current under a certain value and provide a protection measure in case power inverter 260 or any other component in the system is damaged. In an exemplary embodiment, DC power source 301 may be selected as a low voltage DC source, i.e., lower than 50 volts. Current-limiting device 302 may be selected accordingly so that the peak current may be limited to approximately 100 ma in case of a component damage. A low-voltage current-limiting power source 310 therefore may add additional reliability to current sensor testing system 150. Current-limiting device 302 may be comprised of a resistor or a suitable network of components such as resistors, diodes, varistor, or semiconductor devices suitable for limiting current. Current-limiting device 302 may further limit current to the DC power source 301 when high voltage is applied to the DC link 270.

Filter capacitor 303 may be included to provide a low impedance energy source during the power converter's normal switching sequence. Filter capacitor 303 may be charged to a voltage level provided by DC power source 301 through current-limiting device 302. In an exemplary embodiment, filter capacitor 303 may be charged based on the voltage level of DC power source 301, and the energy potential provided by filter capacitor 303 is high enough the drive power inverters 260 and provide substantial current flow through the current sensor 203.

INDUSTRIAL APPLICABILITY

Although the disclosed embodiments are described in association with a power converter current sensor testing system for a machine, the disclosed testing system may be used in any environment where it may be desirable to test an electric component to detect a fault and provide a diagnostic about the fault. Specifically, the disclosed testing system may measure a current signal associated with an electric component, compare the measured signal to a stored profile, and provide a test report to a user. Moreover, the disclosed testing system may be configured to provide diagnostic functions to determine the exact location of the fault.

Figure 4:
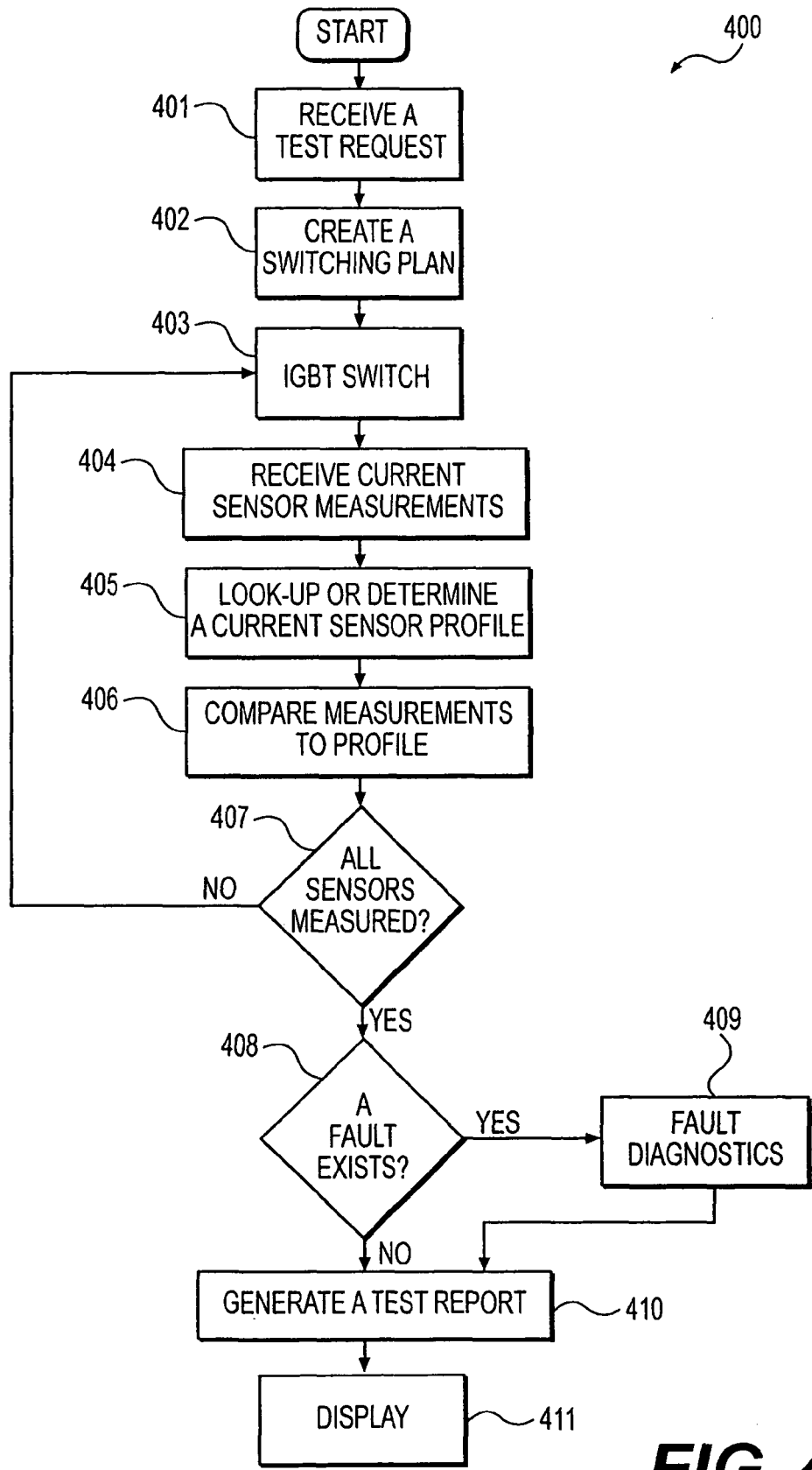
FIG. 4 provides a flowchart of an exemplary operation process of a current sensor test, in accordance with the embodiment of the present disclosure.

FIG. 4 provides a flowchart of an exemplary operation process 400 of a current sensor test, in accordance with the embodiment of the present disclosure. Process 400 may include receiving a test request, in step 401. The test request may include a list of power inverter IDs to specify which power inverters 260 should be included in the test, characteristic data of corresponding electric motors 250 connecting to these power inverters 260, and characteristic data of power source 210. The test request may further include other information, such as when the test should be performed, how the user should be notified, and whether protection actions should be performed if a fault is detected. Process 400 may also include step 402 to generate a switching plan for a plurality of power electronic devices in the at least one power inverter 260, based on the received test request. In step 403, controller 220 may operate to provide switching control signals to switch power electronic devices in pairs. An exemplary switching scheme will be discussed in greater detail below with reference to FIG. 5.

Process 400 may further include receiving current sensor measurements from current sensors being tested, step 404. The measurements may include a magnitude of the current (See FIG. 2), or a current pulse in response to the applied energy pulse (See FIG. 3). In step 405, controller 220 may operate to obtain a profile of the measured current sensor. Controller 220 may look up a corresponding current sensor profile in its storage unit 221, based on the load characteristics. Controller 220 may alternatively determine the current sensor profile based on the test request. The sensor profile may include a list of threshold values, such as a peak current threshold, pulse width threshold, rise time threshold, decay time threshold, and etc. Process 400 may then include step 406 to compare the current sensor measurements to the profile and determine that a certain current sensor has a fault if one or more measurements are out of the threshold range.

According to the exemplary process shown in FIG. 4, in step 407, controller 220 may operate to repeat steps 403, 404, 405, and 406, until all the current sensors are tested, as requested by the test request. Process 400 may then include step 408 to determine whether any fault exists. If no fault is detected, controller 220 may operate to proceed directly to generate a test report, step 410.

If one or more faults are detected, process 400 may include step 409 that performs a fault diagnostic. For example, controller 220 may use all the sensor measurements and their profiles to logically isolate the fault and determine the exact location of the faults. In the event that two current sensors exhibit similar abnormal characteristics, controller 220 may determine that a fault may exist in an external component other than the tested current sensors, due to the unlikely occurrence of two sensors failing in the same manner. For example, a higher than normal peak current would occur at two current sensors when two motor windings have a partial short circuit that reduces their inductance.

After the fault diagnostic is complete, process 400 may proceed to step 410 to generate a test report. The test report may include a header, a summary of current sensors tested, a summary of faults including sensor faults and/or wire harness faults, and a description of the fault locations. In the next step 411, controller 220 may further operate to send the test report for display on a display device 240. The test report may be displayed as a text file, and alternatively, the test report may also be displayed as a diagrammatic chart including a configuration of power converters, graphic views of individual components in power converters, and fault locations marked in a notable manner.

Figure 5:
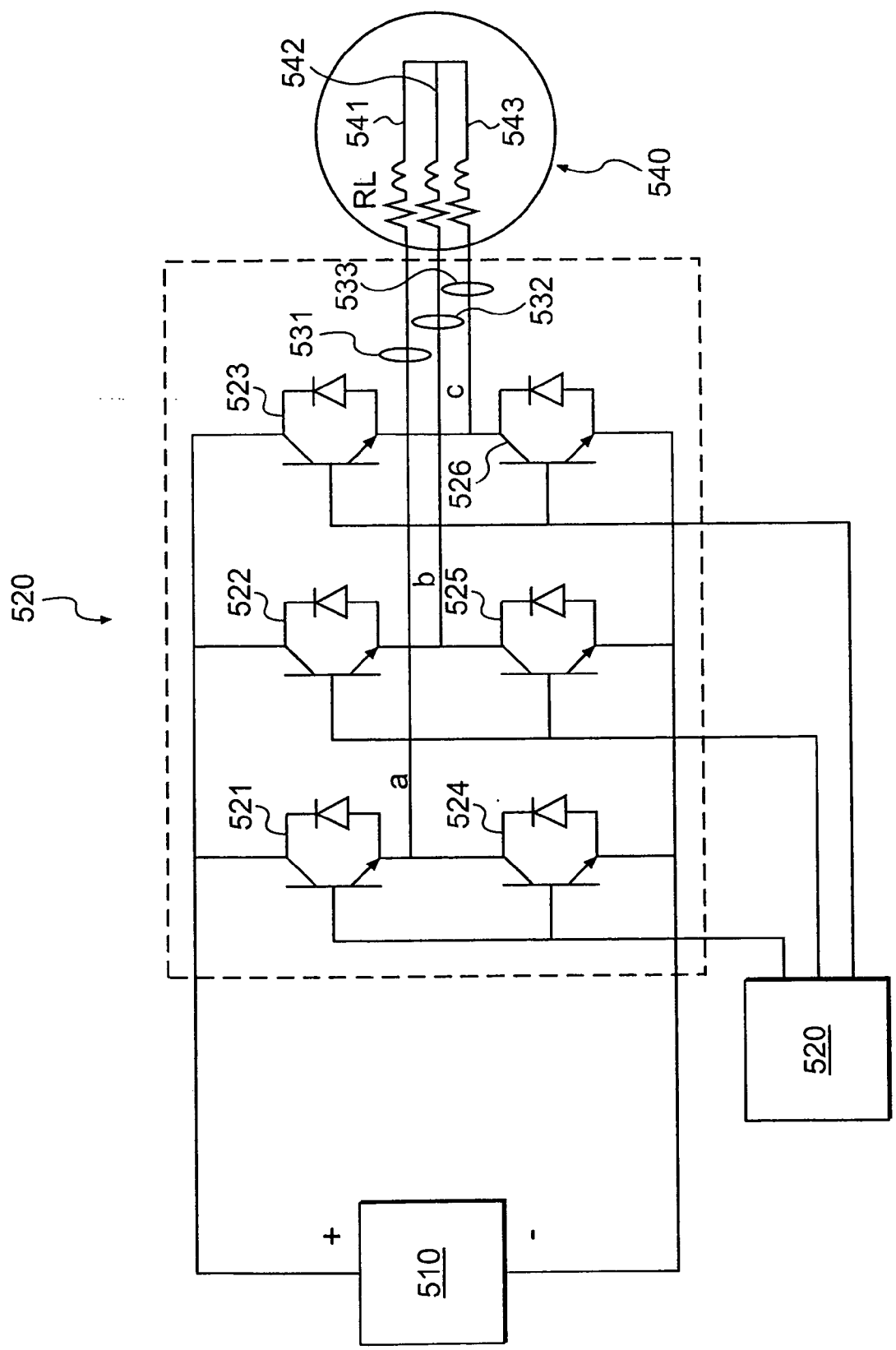
FIG. 5 provides a diagrammatic illustration of an exemplary switching scheme of the power inverter during a current sensor test of FIG. 4, in accordance with the embodiment of the present disclosure.

FIG. 5 provides a diagrammatic illustration of an exemplary switching scheme of the power inverter during a current sensor test of FIG. 4. As shown in FIG. 5, power inverter 520 may couple to power source 510 and have three phases: an a-phase, a b-phase and a c-phase. Each phase may include two IGBT in series. For example, a-phase may include IGBT 521 and IGBT 524, b-phase may include IGBT 522 and IGBT 525, and c-phase may include IGBT 523 and IGBT 526. Each IGBT may include a gate, an emitter and a collector and may be switched on and off by a current applied to the gate. As shown in FIG. 5, gates of all IGBTs may be electrically connected to controller 220 and configured to receive gate driving signals from controller 220. Power inverter 520 may further include current sensors 531, 532, and 533 in a-phase, b-phase and c-phase, respectively. Power inverter 520 may be coupled to a three-phase electric motor 540, which may have loads 541, 542 and 543 that can be symbolically represented by an impedance.

According to the switching plan generated in step 402 of FIG. 4, two current sensors may be tested at a time. For example, current sensors 531 and 532 may be tested first. Accordingly, in step 403, controller 220 may send gate driving signals to switch on IGBTs 521 and 525. As a result, a-phase and b-phase of power inverter 520, together with load 541 and 542 of electric motor 540, form a current path. If both current sensors 531 and 532 work properly and are wired properly, their measurement may have similar waveforms but opposite polarities. Alternatively, to test current sensors 531 and 532, controller 220 may also send gate driving signals to switch on IGBTs 522 and 524. Steps 404-407 of process 400 may then be executed to complete the test for current sensors 531 and 532. Controller 220 may then iterate to repeat step 403 and send gate driving signals to switch on IGBTs 522 and 526. A current path may be formed through current sensors 532 and 533, and loads 542 and 543. Finally, controller 220 may send gate driving signals to switch on IGBTs 523 and 524 and form a current path through current sensors 531 and 533, and loads 541 and 543.

Current sensor testing system 150 in the present disclosure may provide increased accuracy over conventional current sensor testing systems, with the incorporation of a diagnostic function in controller 220. Furthermore, the incorporation of a low-voltage and current-limit power source 310 by one embodiment of the present application may enhance the reliability of current sensor testing system 150. For example, in the event of wire harness fault or current sensor failure, a low-voltage and current-limiting power source 310 may drive the test without damaging components. In addition, the use of current sensor testing system 150 may be more convenient than conventional current sensor testing systems.

It will be apparent to those skilled in the art that various modifications and variations can be made to the disclosed power converter current sensor testing system without departing from the scope of the disclosure. Other embodiments of the present disclosure will be apparent to those skilled in the art from consideration of the specification and practice of the present disclosure. It is intended that the specification and examples be considered as exemplary only, with a true scope of the present disclosure being indicated by the following claims and their equivalents.

What is claimed is:

1. A method of testing a power converter current sensor, comprising:
    receiving a power converter current sensor test request and load characteristic data from a user or a controller;
    obtaining, from a storage unit storing a plurality of power converter current sensor profiles, a power converter current sensor profile that corresponds to the load characteristic data;
    receiving a current measurement from each power converter current sensor being tested, based on the test request;
    comparing the current measurement with the obtained power converter current sensor profile to determine whether a fault exists in the corresponding power converter current sensor; and
    providing the user with a test report.

2. The method of claim 1, further including initiating the test request by the user via a user input interface.

3. The method of claim 1, further including:
    generating a switching plan for a plurality of power electronic devices in at least one power converter, based on the test request; and
    switching on the plurality of power electronic devices, according to the switching plan.

4. The method of claim 1, further including determining, if a fault exists, the location of the fault.

5. The method of claim 1, further including detecting a wire harness fault and determining the location of the fault.

6. The method of claim 5, wherein detecting a wire harness fault further includes measuring currents associated with at least one power converter current sensor not being tested.

7. The method of claim 6, further including providing at least one warning indication in the event of a power converter current sensor fault.

8. The method of claim 1, wherein providing the user with the test report further includes:
    generating the test report; and
    displaying the test report on a display device.

9. The method of claim 1, further including using a low-voltage, current-limited power test source, distinct from a primary power source associated with the power converter, to provide power to the power converter only during the testing of the power converter current sensor.

10. A power converter current sensor testing system, comprising:
    a power source configured to provide power to at least one power converter;
    a storage unit storing a plurality of power converter current sensor profiles;
    a display device; and
    a controller electrically coupled to the at least one power converter, that:
        receives a power converter current sensor test request and load characteristic data associated with a load of the at least one power converter;
        obtains, from the storage unit, a power converter current sensor profile that corresponds to the load characteristic data;
        receives measured currents from power converter current sensors, according to the test request;
        compares the power converter current sensor measurements with the obtained power converter current sensor profile to determine whether a fault exists in each power converter current sensor being tested; and
        provides a warning, via the display device, when it is determined that a fault exists.

11. The power converter current sensor testing system of claim 10, wherein the controller includes a processing unit, configured to determine a location of the fault.

12. The power converter current sensor testing system of claim 10, wherein the controller includes a communication unit configured to switch a plurality of power electronic devices in the at least one power converter.

13. The power converter current sensor testing system of claim 10, wherein the power source is a DC voltage source less than 50 volts.

14. The power converter current sensor testing system of claim 13, wherein the DC voltage source includes a capacitor that is charged to provide energy to drive the at least one power converter.

15. The power converter current sensor testing system of claim 13, wherein the DC voltage source includes a current-limiting device.

16. The power converter current sensor testing system of claim 10, wherein the power source includes an AC power source and a power converter that converts the AC power to a DC power.

17. The power converter current sensor testing system of claim 10, further including a user input interface configured to receive the test request from a user.

18. The system of claim 10, further including a low-voltage, current-limited power test source, distinct from a primary power source associated with the at least one power converter, configured to provide power to the at least one power converter only during the testing of the power converter current sensor.

19. A machine, comprising:
    a power source;
    at least one electric load, having at least one phase;
    at least one power converter, having at least one phase and a current sensor associated with each phase; and
    a power converter current sensor testing system electrically coupled to the at least one power converter, wherein the power converter current sensor testing system includes:

a storage unit storing a plurality of power converter current sensor profiles;

a controller electrically coupled to the at least one power converter that:

tests the power converter current sensor associated with each phase; including to:

receives a test request with load characteristic data of the at least one electric load;

obtains, from the storage unit, a power converter current sensor profile for the tested power converter current sensor that corresponds to the load characteristic data;

determines a switching plan for a plurality of power electronic devices of the at least one power converter based on the test request;

switches the plurality of power electronic devices, in accordance with the switching plan, to receive a current measurement from the tested power converter current sensor; and compares the current measurement to the obtained power converter sensor profile to determine whether a fault exists in the tested power converter current sensor; and a display device configured to display a test report based on the testing of the power converter current sensor associated with each phase.

20. The machine of claim 19, wherein the power converter current sensor testing system further includes a low-voltage, current-limited power test source, distinct from a primary power source associated with the at least one power converter, configured to provide power to the at least one power converter only during the testing of the power converter current sensor associated with each phase.

* * * * *